United States Patent
Kishi

(10) Patent No.: US 6,664,819 B2
(45) Date of Patent: Dec. 16, 2003

(54) FREQUENCY SYNTHESIZER FOR IMPROVING A UNIQUE DDS CHARACTERISTIC

(75) Inventor: Takahiko Kishi, Yokohama (JP)

(73) Assignee: Samsung Electronics Co., Inc. (KR)

( * ) Notice: Subject to any disclaimer, the term of this patent is extended or adjusted under 35 U.S.C. 154(b) by 0 days.

(21) Appl. No.: 10/085,825

(22) Filed: Feb. 27, 2002

(65) Prior Publication Data

US 2002/0130689 A1 Sep. 19, 2002

(30) Foreign Application Priority Data

Mar. 2, 2001 (JP) ........................................ 2001-058395

(51) Int. Cl.[7] .............................................. H03B 21/00
(52) U.S. Cl. ....................... 327/106; 327/129; 327/355; 708/270
(58) Field of Search ................................ 327/105, 106, 327/107, 113, 129, 133, 124, 355, 356; 708/101, 103, 270–277, 290; 455/260

(56) References Cited

U.S. PATENT DOCUMENTS

| | | | | | |
|---|---|---|---|---|---|
| 3,568,069 | A | * | 3/1971 | Gabor | 327/107 |
| 4,977,613 | A | * | 12/1990 | Holcomb et al. | 455/182.3 |
| 5,179,348 | A | * | 1/1993 | Thompson | 327/105 |
| 5,408,201 | A | * | 4/1995 | Uriya | 331/2 |

* cited by examiner

*Primary Examiner*—Minh Nguyen
(74) *Attorney, Agent, or Firm*—Dilworth & Barrese, LLP

(57) ABSTRACT

A frequency synthesizer that improves a unique DDS characteristic, while maintaining a circuit scale (ROM size) of a direct digital synthesizer (DDS). A first digital signal generator generates a quantized frequency signal, and a second digital signal generator generates a frequency signal having a fine frequency resolution and many spurious signals as compared with the first digital signal generator. A filter performs band rejection on an output of the second digital signal generator, and a mixer mixes an output of the first digital signal generator with an output of the filter.

12 Claims, 8 Drawing Sheets

FREQUENCY SYNTHESIZER FOR IMPROVING A UNIQUE DDS CHARACTERISTIC

PRIORITY

This application claims priority to an application entitled "Frequency Synthesizer" filed in the Japanese Patent Office on Mar. 2, 2001 and assigned Serial No. 2001-58395, the contents of which are hereby incorporated by reference.

BACKGROUND OF THE INVENTION

1. Field of the Invention

The present invention relates generally to a frequency synthesizer for generating a sine wave and a cosine wave by digital signal processing, and a frequency synthesizer capable of reducing spurious signals.

2. Description of the Related Art

When a direct digital synthesizer (DDS) is used in generating a local signal of a receiver, spurious signals generated by operation of the DDS deteriorate an adjacent channel interference characteristic and an outband interference characteristic. Likewise, when the DDS is used to generate a local signal of a transmitter, the spurious signals interfere with adjacent frequencies.

FIG. 6 illustrates how spurious signals are generated in a conventional DDS. The spurious signals caused by insufficient operation accuracy of the DDS are generated because of: (i) a phase requantization error $e_p$ due to a difference between an operation word length j of a phase operator comprised of an adder 71 and a phase register 72, and an address length k of a ROM (Read Only Memory) 73 for converting phase data to amplitude data; and (ii) an amplitude quantization error $e_a$ of output bits of the ROM 73. As illustrated in FIG. 7, the spurious signals are uniformly distributed around a frequency fc of a desired signal. If the operation word length j is set to be equal to the address length k (j=k) to improve the operation accuracy of the DDS, no spurious signal will be generated. Further, if an output data with a width m of the ROM 73, as illustrates in FIG. 6, is set to a sufficiently large value, the spurious signals caused by the amplitude error will have a negligible level.

However, when the operation word length j of the phase operator is set to be equal to the address length k of the ROM 73, the ROM size is doubled each time the address length k is increased by one bit. Therefore, it is difficult to realize the ROM 73 when the operation word length is relatively long. Accordingly, a method using the addition theorem of a trigonometric function has been proposed as a method for realizing an equivalent large ROM size with an actual small ROM size. For example, if j0-bit frequency setting data is F=A+B, where A represents data of j1 bits on the MSB (Most Significant Bit) side and B represents data of remaining j2 bits on the LSB (Least Significant Bit) side, then cos(F) and sin(F) are defined as $$\cos(F)=\cos(A+B)=\cos A \cdot \cos B - \sin A \cdot \sin B$$

$$\sin(F)=\sin(A+B)=\sin A \cdot \cos B + \cos A \cdot \sin B$$

That is, the frequency setting data F can be generated by synthesizing the frequency setting data A and the frequency setting data B in accordance with the above formulas. For example, in the case where the frequency setting data F is comprised of 16 bits, even though the output data width m of the ROM 73 is 1 bit (m=1), the ROM 73 requires a capacity of 64 K words×2, as shown in the following formulas.

(1) For cos(F), $2^{16}$ words=65,536 words (2) For sin(F), $2^{16}$ words=65,536 words However, if the 16-bit frequency setting data F is divided into 8-bit frequency setting data A and 8-bit frequency setting data B, the required ROM capacity becomes 256 words, a square root of 65,536 words, as shown in the following formulas.

(2) For cos(A), 256 words (2) For sin(A), 256 words (3) For cos(B), 256 words (4) For sin(B), 256 words That is, since the required total capacity becomes 256 words×4, the required ROM size becomes 1/128 times the ROM size of the conventional DDS.

FIG. 8 illustrates a structure of a DDS using the addition theorem of a trigonometric function according to the prior art. As illustrated, when j0-bit frequency setting data F represented by a phase variation width $\Delta\phi$ is received, a phase operator comprised of an adder 51 and a phase register 52 accumulates the frequency setting data F into phase data Ff. The j0-bit phase data Ff is separated into j1-bit phase data Af and j2-bit phase data Bf starting from the MSB side, and k1 bits in the separated j1-bit phase data Af on the MSB side are applied as address signals to a coarse cos(A) ROM-A 53 and a coarse sin(A) ROM-B 54, in each of which a table for converting phase data to amplitude data is stored. The ROM-A 53 and the ROM-B 54 sequentially output m-bit amplitude data, respectively. Here, the ROM-A 53 and the ROM-B 54 register quantized cosine and sine waves of a frequency corresponding to the j1 bits on the MSB side of the phase data Ef, respectively.

Meanwhile, k2 bits in the remaining j2-bit phase data Bf are applied as address signals to a fine cos(B) ROM-C 55 and a fine sin(B) ROM-D 56, in each of which a table for converting phase data to amplitude data is stored. The ROM-C 55 and the ROM-D 56 sequentially output m-bit amplitude data, respectively. Here, the ROM-C 55 and the ROM-D 56 register quantized cosine and sine waves of a frequency corresponding to the remaining j2 bits of the phase data Ef, respectively. A complex mixer 57 synthesizes the m-bit amplitude data outputs from the ROM-A 53, ROM-B 54, ROM-C 55 and ROM-D 56, and generates output signals cos(n) and sin(n) of the frequency synthesizer. In order to calculate a real-part output signal, the complex mixer 57 includes a multiplier 58 for multiplying a real-part input signal T1 by a real-part input signal T3, a multiplier 59 for multiplying an imaginary-part input signal T2 by an imaginary-part input signal T4, and a subtracter 60 for synthesizing an output of the multiplier 58 and an output of the multiplier 59. Further, in order to calculate an imaginary-part output signal, the complex mixer 57 includes a multiplier 61 for multiplying the real-part input signal T1 by the imaginary-part input signal T4, a multiplier 62 for multiplying the real-part input signal T3 by the imaginary-part input signal T2, and an adder 63 for synthesizing an output of the multiplier 61 and an output of the multiplier 62. The output of the ROM-A 53 is connected to a terminal T1 of the complex mixer 57, the output of the ROM-B 54 to a terminal T2 of the complex mixer 57, the output of the ROM-C 55 to a terminal T3 of the complex mixer 57, and the output of the ROM-D 56 to a terminal T4 of the complex mixer 57. As a result, the frequency synthesizer of FIG. 8 outputs carrier signals cos(n) and sin(n) with a frequency corresponding to the frequency setting data F=A+B.

However, when the frequency setting data F needs 32 bits, $2^{32}$=4,294,967,296 words and a square root of 4,294,967, 296 words is 65,536 words. Even though the frequency setting data F is divided into data A and data B, a 64K words×4=256K word-ROM is required. Thus, the DDS cannot implement the high-speed operation. When a desired operation word length of the frequency setting data F is increased, it is difficult to set an address length k1 of a ROM for converting frequency setting data A to amplitude data and an address length k2 of a ROM for converting frequency setting data B to amplitude data such that j1=k1 and j2=k2. As a result, j1>k1 and j2>k2. In this case, since the ROM size is smaller than when the frequency is not divided, it is possible to reduce error generated. However, since phase errors are generated in the frequency setting data A and the frequency setting data B, generation of the spurious signals is unavoidable.

In particular, the spurious signals of the DDS are uniformly distributed as illustrated in FIG. 7. Thus, when used as a local signal generator of a radio communication apparatus, the DDS undergoes interference over a wide range in a receiver and causes interference over a wide range in a transmitter. This is symmetrical considering that spurious signals of an analog oscillator generally have a negligibly low level in a point far way from a signal although a carrier-to-noise ratio (C/N) is not high in the vicinity of the signal.

SUMMARY OF THE INVENTION

Therefore, the present invention has been made in view of the above problems, and it is an object of the present invention to provide a frequency synthesizer for improving a unique DDS characteristic, while maintaining a circuit scale (ROM size) of a direct digital synthesizer (DDS).

To achieve the above and other objects, the preset invention provides a frequency synthesizer for a radio communication system comprising a first digital signal generator for generating a quantized frequency signal; a second digital signal generator for generating a frequency signal having a fine frequency resolution and many spurious signals as compared with the first digital signal generator; a filter for performing band rejection on an output of the second digital signal generator; and a mixer for mixing an output of the first digital signal generator with an output of the filter.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
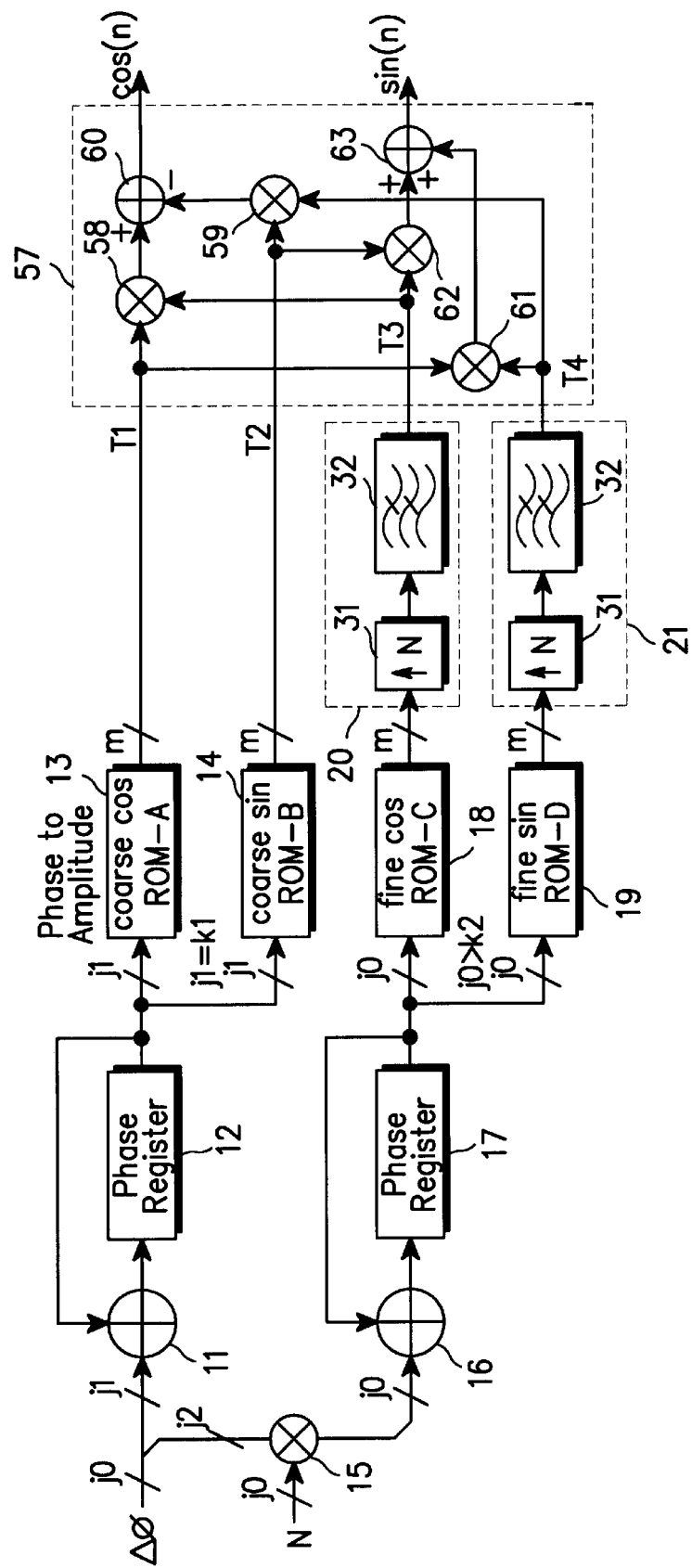
FIG. 1 illustrates a structure of a frequency synthesizer according to an embodiment of the present invention.

FIG. 1 illustrates a structure of a frequency synthesizer according to an embodiment of the present invention. Referring to FIG. 1, the frequency synthesizer includes a first digital signal generator for generating a quantized coarse frequency signal, a second digital signal generator for generating a quantized fine frequency signal having a fine frequency resolution and more spurious components as compared with the first digital signal generator, a filter set for removing the spurious signals by band rejecting an output of the second digital signal generator, and a mixer 57 for synthesizing an output of the first digital signal generator and an output of the filter set. The first digital signal generator is comprised of an adder 11, a phase register 12, a ROM-A 13, and a ROM-B 14, while the second digital signal generator is comprised of an adder 16, a phase register 17, a ROM-C 18 and a ROM-D 19. Further, the filter set is comprised of an interpolation filter 20 and an interpolation filter 21.

In operation, j0-bit input frequency data represented by a phase variation width $\Delta\phi$ is separated into j1-bit frequency data A and j2-bit frequency data B starting from the MSB side. A phase operator comprised of an adder 11 and a phase register 12 accumulates the separated j1 bits on the MSB side into phase data Af. The j1-bit phase data Af is applied as address signals to the coarse cos ROM-A 13 with k1-bit address signal lines (where k1=j1), in which a table for converting phase data to amplitude data is registered, and the coarse sin ROM-B 14 with k1-bit address signal lines, in which a table for converting phase data to amplitude data is registered. The ROM-A 13 and the ROM-B 14 sequentially output m-bit amplitude data corresponding to the addresses provided thereto, respectively. Here, the ROM-A 13 and the ROM-B 14 register quantized cosine and sine waves of a frequency corresponding to the j1 bits on the MSB side of the phase data F, respectively. The adder 11, the phase register 12, the ROM-A 13 and the ROM-B 14 constitute a first DDS or a first digital signal generator.

Meanwhile, the remaining j2 bits on the LSB side (or right hand side) with respect to the j1-bit phase data are multiplied by a j0-bit coefficient N, a sampling rate conversion ratio N, by a multiplier 15, and thus converted to j0-bit frequency setting data B'. A phase operator comprised of an adder 16 and a phase register 17 accumulates the j0-bit frequency setting data B' output from the multiplier 15 into phase data Bf. For example, when the two DDSs generating amplitude data with the same bit length operate with a sampling frequency 1 and a sampling frequency N, respectively, a ratio of an output frequency of one DDS to an output frequency of another DDS is also 1:N. In order to reduce operations by decreasing a sampling frequency of the second DDS after the adder 16 to 1/N times the sampling frequency of the first DDS after the adder 11, the frequency data B is multiplied by N and thus corrected into the frequency data B'. The corrected frequency data B' is accumulated into the phase data Bf.

The j0-bit phase data Bf is applied as address signals to the fine cos ROM-C 18 with k2-bit address signal lines (where j0>k2), in which a table for converting phase data to amplitude data is stored, and the fine sin ROM-D 19 with k2-bit address signal lines, in which a table for converting phase data to amplitude data is stored. The ROM-C 18 and the ROM-D 19 sequentially output m-bit amplitude data, respectively. Here, the ROM-C 18 and the ROM-D 19 register quantized cosine and sine waves of a frequency corresponding to the remaining j2 bits of the phase data F, respectively. The adder 16, the phase register 17, the ROM-C 18 and the ROM-D 19 constitute a second DDS or a second digital signal generator.

The first digital signal generator generates frequency signals corresponding to the phase data calculated by accumulating j1 bits (where j1 is an integer) on the MSB side of frequency setting data, while the second digital signal generator generates frequency signals corresponding to the phase data calculated by multiplying k2-bit data (where k2=j1−log$_2$N) validating j2 bits (where j2=j0−j1) on the LSB side of the frequency setting data by N and then accumulating the amplified value. In this case, an operating speed of the second digital signal generator is lower than an operating speed of the first digital signal generator by a sampling frequency ratio of the first digital signal generator to the second digital signal generator. That is, the present invention can achieve both a wide frequency variation width and a low spurious level required in the direct digital synthesizer (DDS) by realizing the two digital signal generators.

Thereafter, the interpolation filters 20 and 21 increase N times sampling frequencies of the m-bit amplitude data output from the ROM-C 18 and the m-bit amplitude data output from the ROM-D 19, respectively, so that the sampling frequencies become equal to those of the j1-bit signals. That is, the interpolation filters 20 and 21 are used to equalize an output sampling frequency of the second digital signal generator to an output sampling frequency of the first digital signal generator. Each of the interpolation filters 20 and 21 is comprised of an up-sampler 31 with a sampling rate conversion ratio N and a lowpass filter 32 for removing an image component generated by the up-sampler 31. The interpolation filters 20 and 21 interpolate the m-bit amplitude data outputs of the ROM-C 18 and the ROM-D 19, respectively, into signals with an N-fold sampling rate. That is, signals with a desired sampling rate are obtained by performing N-fold interpolation on the signals whose sampling rate is changed to 1/N. The lowpass filters 32 reject bands other than the band where generation of the spurious signals is allowed in the output of the second digital signal generator. The present invention realizes the frequency synthesizer preventing interference with adjacent channels, using the interpolation filters 20 and 21.

Next, the complex mixer 57 synthesizes the m-bit amplitude data outputs of the ROM-A 13, the ROM-B 14, the interpolation filter 20 and the interpolation filter 21, and generates output signals cos(n) and sin(n) of the frequency synthesizer. As described in the prior art, in order to calculate a real-part output signal, the complex mixer 57 includes a multiplier 58 for multiplying a real-part input signal T1 by a real-part input signal T3, a multiplier 59 for multiplying an imaginary-part input signal T2 by an imaginary-part input signal T4, and a subtracter 60 for synthesizing an output of the multiplier 58 and an output of the multiplier 59. Further, in order to calculate an imaginary-part output signal, the complex mixer 57 includes a multiplier 61 for multiplying the real-part input signal T1 by the imaginary-part input signal T4, a multiplier 62 for multiplying the real-part input signal T3 by the imaginary-part input signal T2, and an adder 63 for synthesizing an output of the multiplier 61 and an output of the multiplier 62. The output of the ROM-A 13 is connected to a terminal T1 of the complex mixer 57, the output of the ROM-B 14 to a terminal T2 of the complex mixer 57, the output of the interpolation filter 20 to a terminal T3 of the complex mixer 57, and the output of the interpolation filter 21 to a terminal T4 of the complex mixer 57. As a result, the frequency synthesizer outputs carrier signals cos(n) and sin(n) with a frequency corresponding to the frequency setting data F=A+B. Meanwhile, the digital signal generators generate output signals having a constant phase and amplitude, when the frequency setting data has a zero (0) value. That is, it is possible to disable the digital signal generators, when necessary.

Next, a method for using the frequency synthesizer according to an embodiment of the present invention to reduce the spurious signals in number as compared with the conventional frequency synthesizer will be described with reference to FIGS. 2A to 2D.

Figure 2:
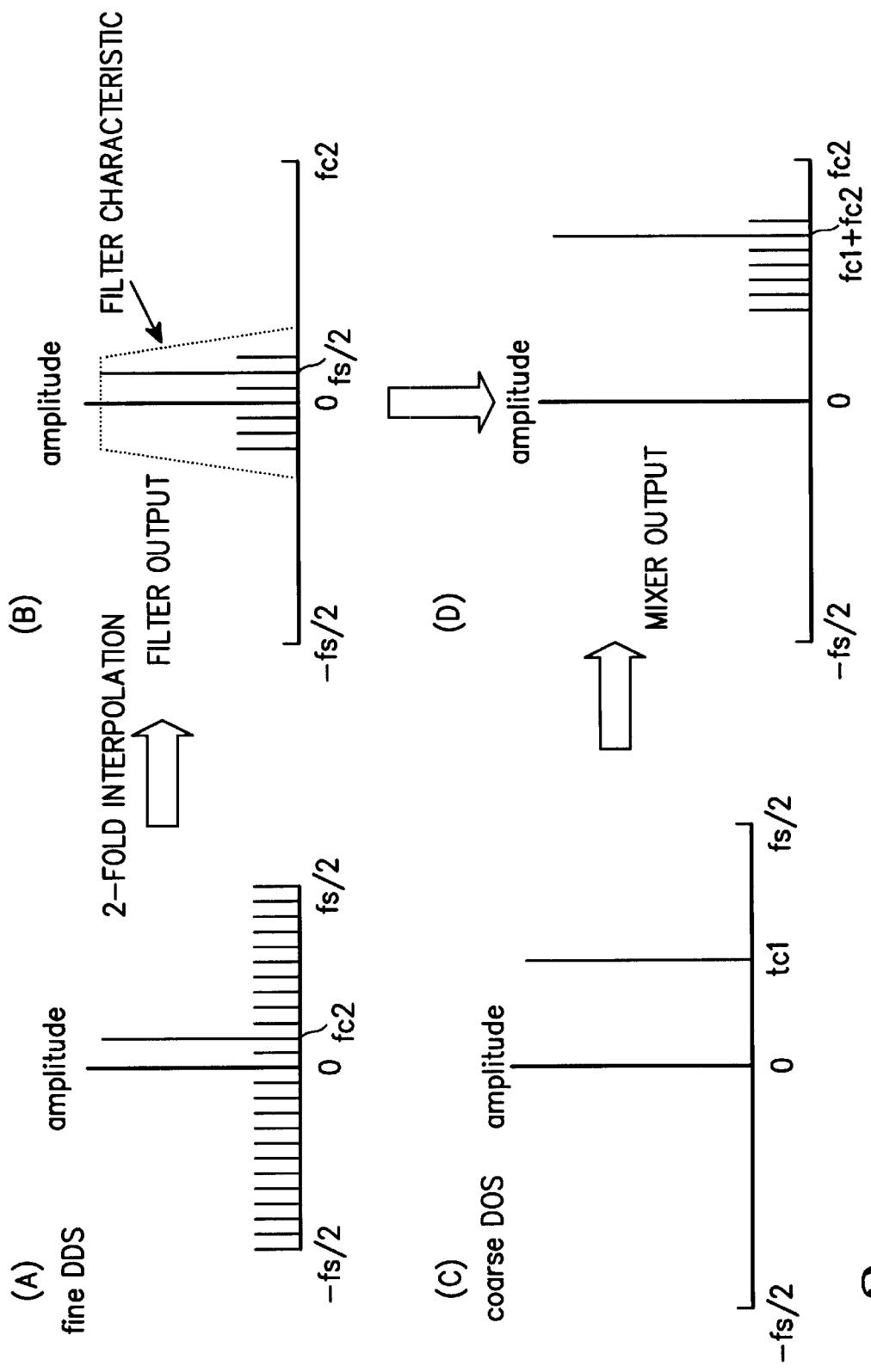
FIGS. 2A to 2D illustrate how the frequency synthesizer according to an embodiment of the present invention reduces spurious signals.
Figure 7:
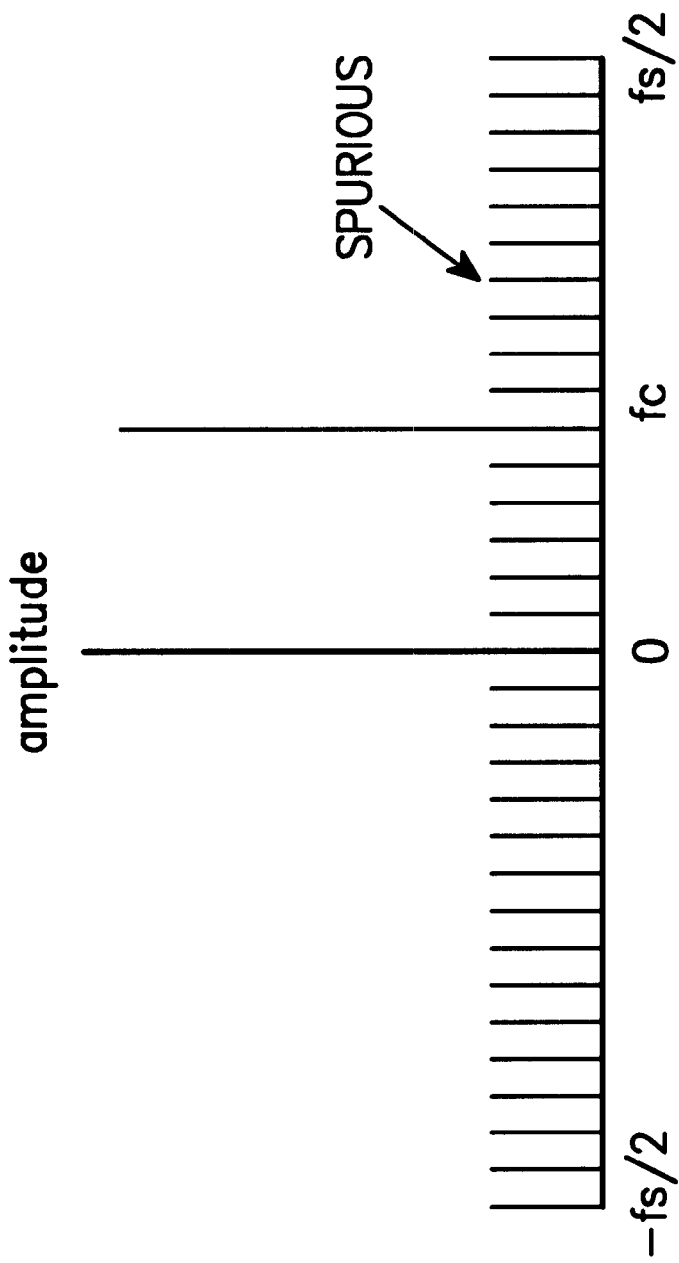
FIG. 7 illustrates uniformly distributed spurious signals in the conventional DDS.
Figure 8:
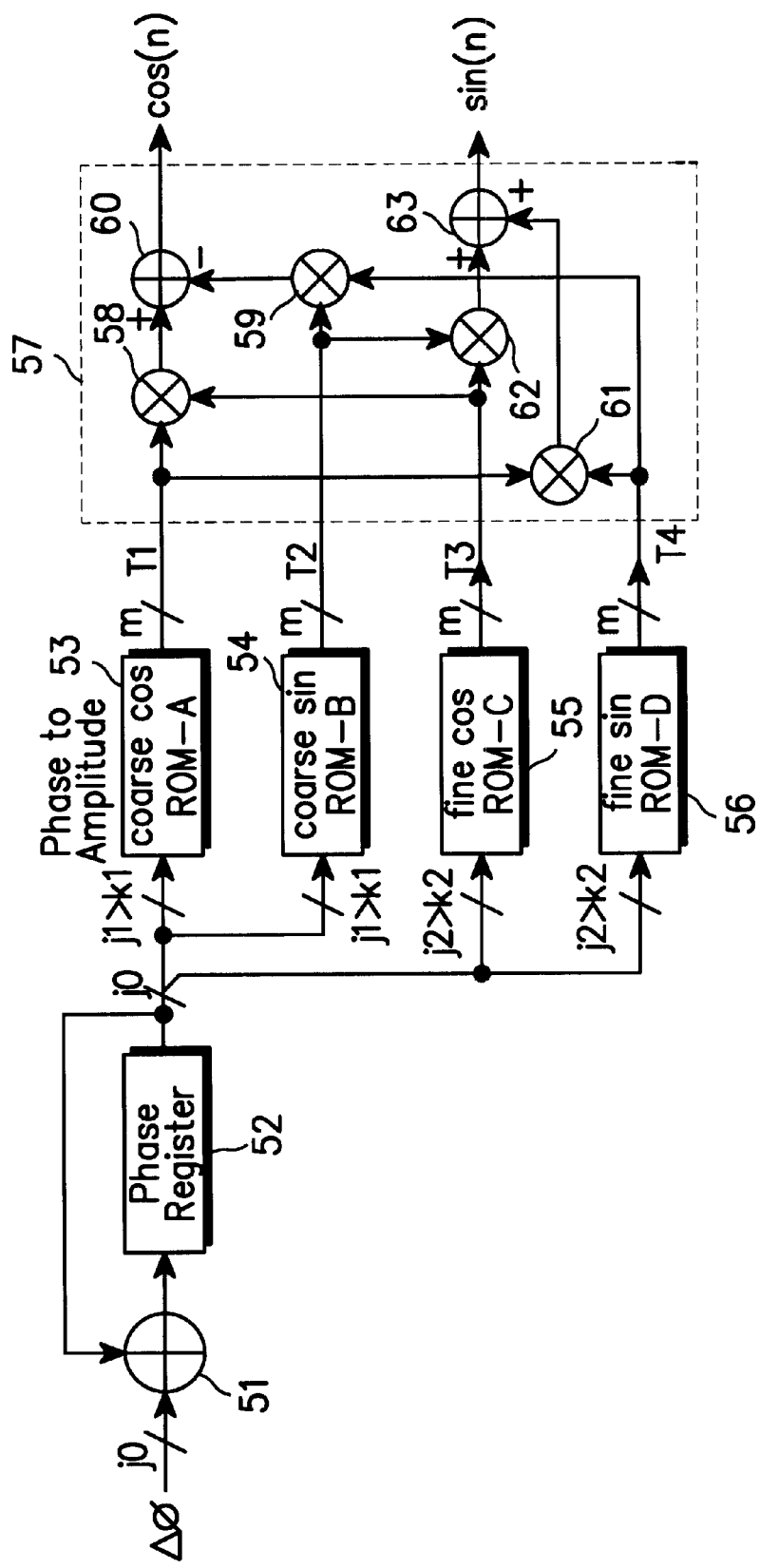
FIG. 8 illustrates a structure of a conventional frequency synthesizer.

Specifically, FIG. 2A illustrates a frequency characteristic of the signals output from the ROM-C 18 and the ROM-D 19 of FIG. 1. Here, the spurious signals are uniformly distributed as in FIG. 7. FIG. 2B illustrates a frequency characteristic of the signals output from the interpolation filters 20 and 21 after performing 2-fold interpolation on the signals shown in FIG. 2A. As illustrated, the signals are subjected to band rejection by the interpolation filters 20 and 21, so that the spurious signals exist only in the pass band of the interpolation filters 20 and 21. FIG. 2C illustrates a frequency characteristic of the signals output from the ROM-A 13 and the ROM-B 14 of FIG. 1. Here, no spurious signal is generated, since a requantization error due to a difference between an operation word length of a phase operator and an address length of a ROM for converting phase data to amplitude data is not generated. FIG. 2D illustrates a frequency characteristic of the signals determined by multiplying the signals of FIG. 2B by the signals of FIG. 2C by the complex mixer 57. As illustrated, the spurious signals included in the output of the frequency synthesizer are equal in number to the spurious signals illustrated in FIG. 2B, existing in the pass band of the interpolation filters. Thus, it can be understood that the spurious signals of the frequency synthesizer according to an embodiment of the present invention are much smaller in number than the spurious signals of the conventional frequency synthesizer of FIG. 7.

A modified frequency synthesizer according to another embodiment of the present invention will be described herein below. In the case where the sampling rate conversion ratio N is set to a radical root of 2, it is possible to calculate the frequency setting data B' by multiplying the frequency setting data B by N and then shifting the data to the MSB side by log$_2$N bits, without using the multiplier 15.

Figure 5:
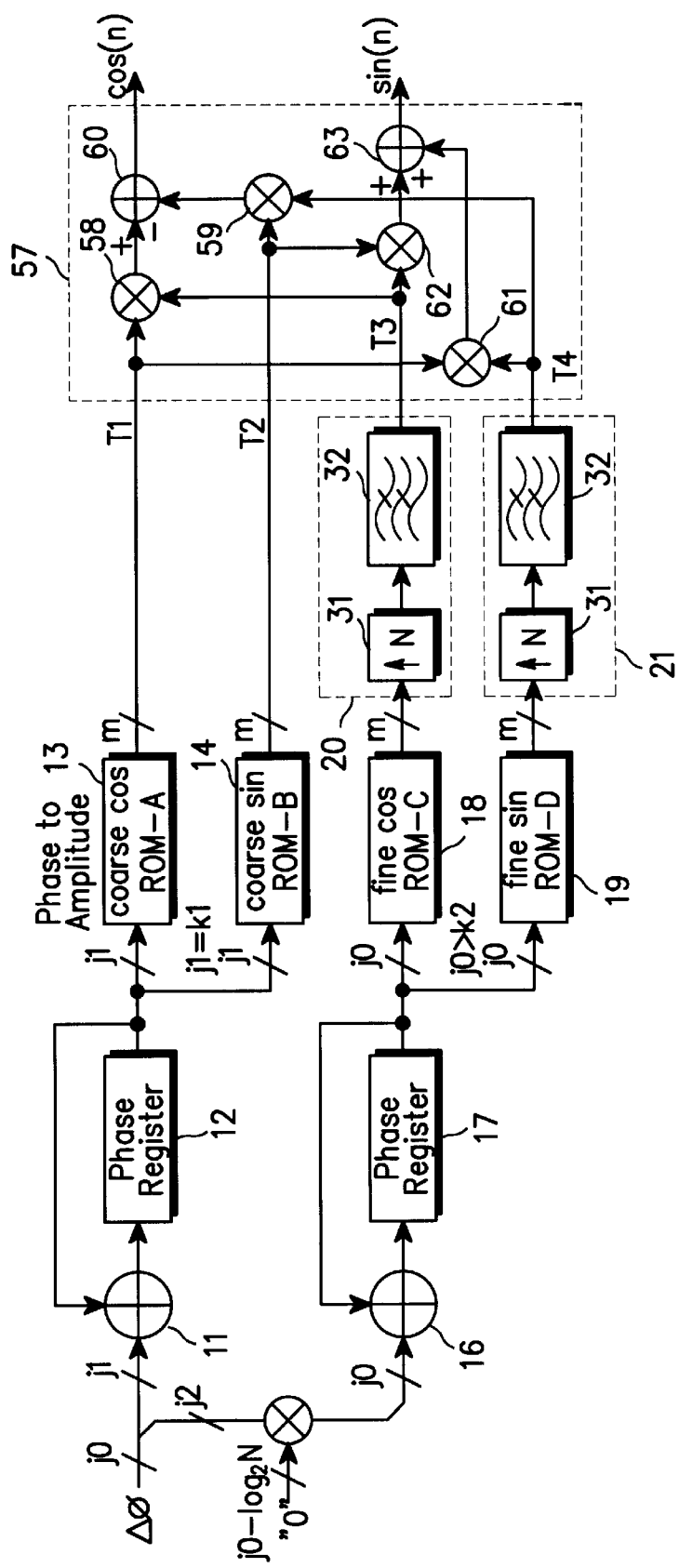
FIG. 5 illustrates a circuit structure of a modified frequency synthesizer according to another embodiment of the present invention.
Figure 6:
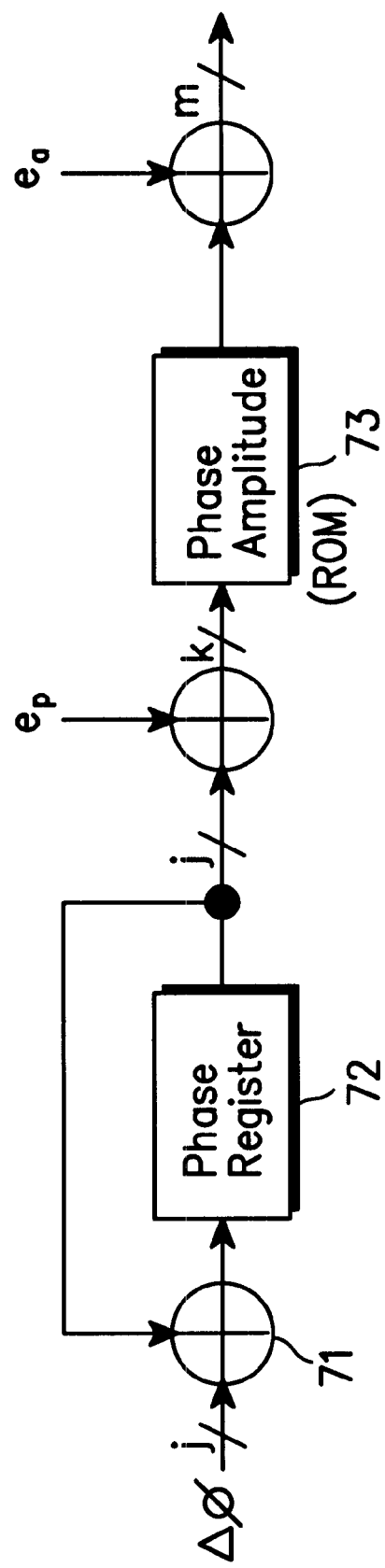
FIG. 6 illustrates how spurious signals are generated in a conventional DDS.

FIG. 5 illustrates a modified frequency synthesizer according to another embodiment of the present invention. The modified frequency synthesizer calculates frequency setting data B' by shifting the data by log$_2$N bits to the MSB side by adding j0−log$_2$N zero (0) bits to the remaining j2 bits on the LSB side with respect to the j1 bits of the j0-bit phase data, instead of using the multiplier 15 for multiplying the remaining j2 bits on the LSB side by a coefficient N, the sampling rate conversion ratio N. Since the frequency setting data B' can be simply calculated by bit shifting, it is possible to achieve a reduction in circuit scale and an increase in the operation speed. In this case, the second digital signal generator generates frequency signals corresponding to the phase data calculated by shifting K-bit data (where K=X−log$_2$N) validating Z bits (where Z=X−Y) on the LSB side of the frequency setting data by log$_2$N bits to the MSB side and then accumulating the shifted value. In addition, since the interpolation filters 20 and 21 convert a frequency of the signals output from the ROM-C 18 and the ROM-D 19 to a frequency close to '0', a CIC (Cascade Integrated Comb) filter illustrated in FIG. 3 is used for the interpolation filters.

Figure 3:
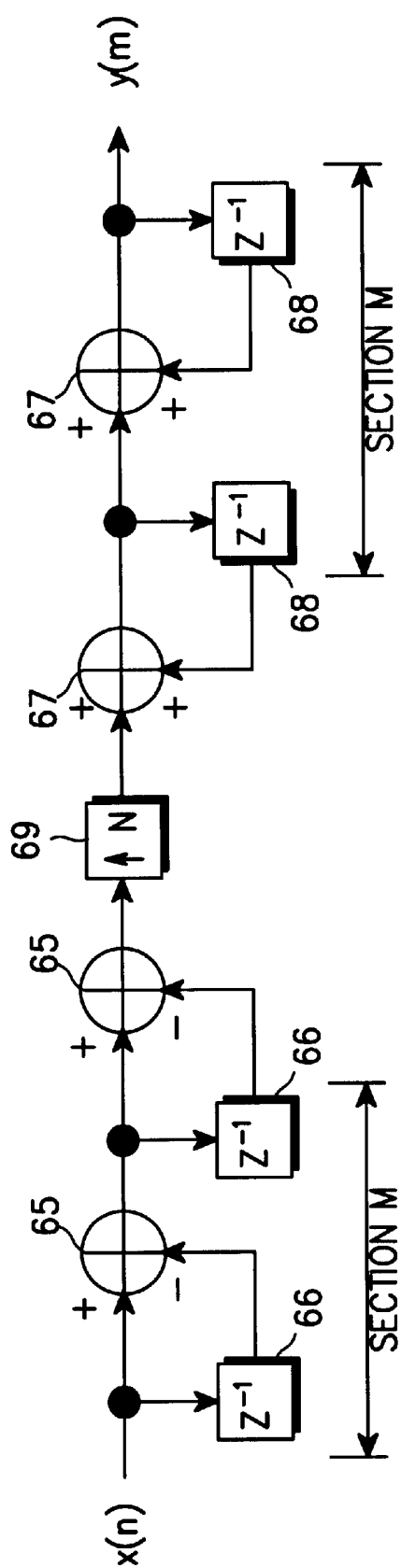
FIG. 3 illustrates a structure of a CIC (Cascade Integrated Comb) filter with no multiplier according to an embodiment of the present invention.
Figure 4:
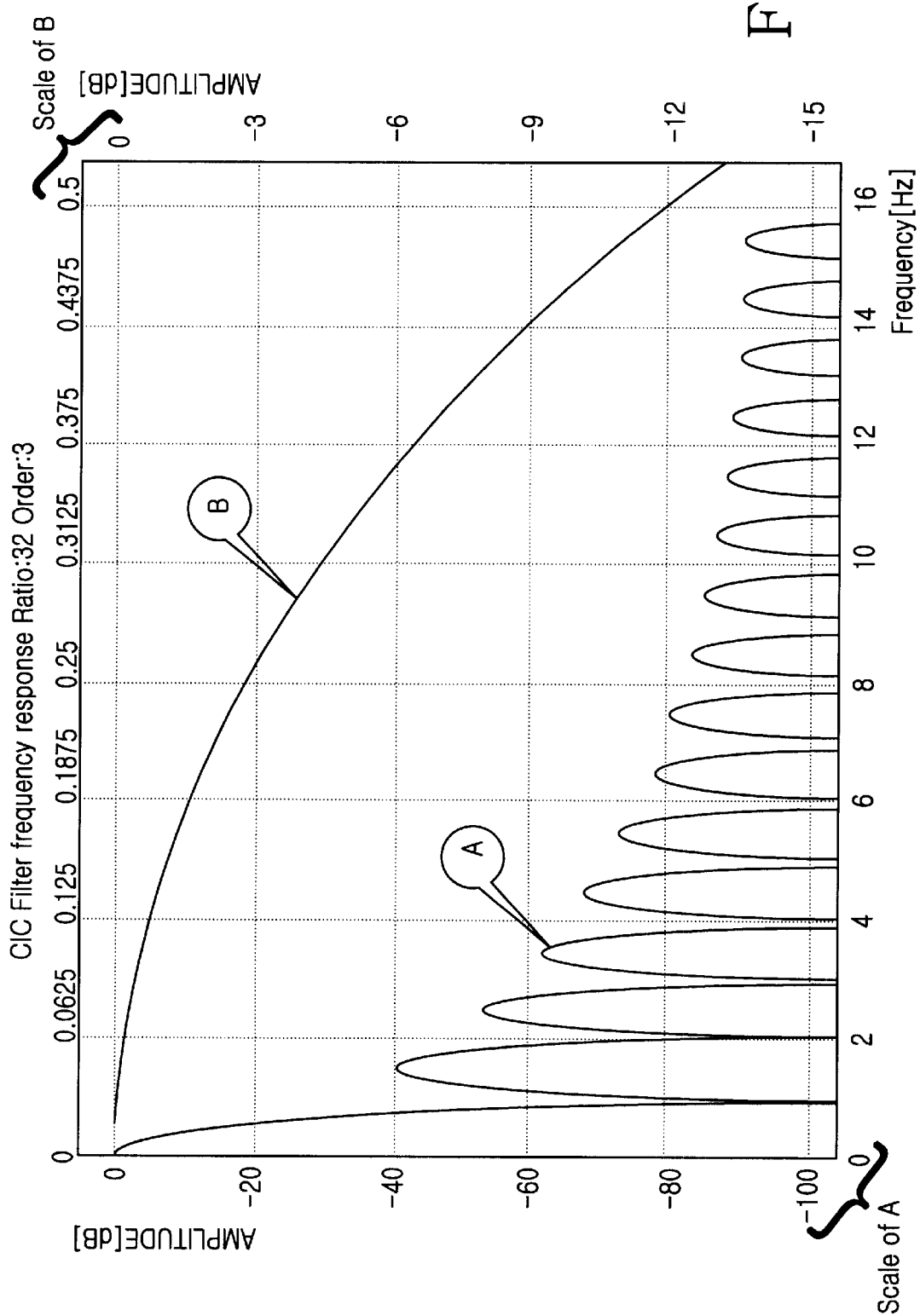
FIG. 4 illustrates a frequency characteristic of input/output signals of the CIC filter shown in FIG. 3.

Referring to FIG. 3, the CIC filter includes a comb filter for a section M, a lowpass filter for the section M, and an N-fold up-sampler 69 interposed between the comb filter and the lowpass filter. The comb filter is comprised of subtracters 65 and delays 66, and the lowpass filter is comprised of adders 67 and delays 68. FIG. 4 illustrates a frequency characteristic of input/output signals of the CIC filter. It is possible to reduce the circuit scale by using the CIC filter with no multiplier for the interpolation filters. In addition, by setting the number of bits of the signals output from the ROM-A 13 and the ROM-B 14 to a value larger than the number of bits of the signals output from the ROM-C 18 and the ROM-D 19, the spurious signals caused by an amplitude quantization error in the output of the frequency synthesizer are dominated by the signals output from the ROM-C 18 and the ROM-D 19 in a region within the pass band of the lowpass filters 32, and dominated by the signals output from the spurious-free ROM-A 13 and ROM-B 14 in a region out of the pass band of the lowpass filters 32. In this case, a spurious level of the second digital signal generator determines the spurious signals within a filtering band of the frequency synthesizer. However, the spurious level is lower than in the filtering band, considering that the spurious signals of the second digital signal generator are suppressed by the filters in the region out of the filtering band and the spurious level of the first digital signal generator having lower amplitude error and phase error than those of the second digital signal generator is low.

Although the embodiments of the present invention have performed complex signal processing, it is also possible to perform real signal processing as far as signal restoration does not occur on a frequency of the signals output from the ROM-C 18 and the ROM-D 19 and a pass bandwidth of the interpolation filters 20 and 21. In addition, the present invention can use not only the fundamental DDS of FIG. 1 but also the improved DDSs. For example, by replacing the conventional DDS with one or both of the first DDS after the adder 11, or the second DDS after the adder 16 and then separating the ROM, it is possible to improve distribution the spurious signals with the lower circuit scale.

As described above, the present invention restricts the spurious signals uniformly generated in the digital frequency synthesizer, to the vicinity of the carrier, thus making it possible to realize a frequency synthesizer having fewer spurious signals while maintaining the minimum ROM size. In particular, the spurious signals located far away from the carrier are susceptible to suppression. In addition, the spurious restriction filter does not use a multiplier, thus making it possible to realize a frequency synthesizer with a good frequency characteristic without increasing power consumption. Further, by increasing a ratio of the number of samples of the first digital signal generator having fewer spurious signals and a coarse frequency step to the number of samples of a second digital signal generator having many spurious signals and a fine frequency step, it is possible to decrease an operation speed of the second digital signal generator compared with an operation speed of the first digital signal generator by a sampling frequency ratio N of the first digital signal generator to the second digital signal generator, and realize a frequency synthesizer with reduced power consumption.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A frequency synthesizer for a radio communication system, comprising:
   a first digital signal generator for generating a first frequency signal with a first output sampling frequency;
   a second digital signal generator for generating a second frequency signal with a second output sampling frequency having a fine frequency resolution and many spurious signals as compared with the first digital signal generator;
   a filter for performing band rejection on the second frequency signal of the second digital signal generator; and
   a mixer for mixing the first frequency signal of the first digital signal generator with an output of the filter;
   wherein the filter includes an interpolation filter for performing band rejection by equalizing the second output sampling frequency of the second digital signal generator to the first sampling frequency of the first digital signal generator.

2. The frequency synthesizer as set forth in claim 1, wherein when a frequency setting data is X bits (where X is an integer), the first digital signal generator generates the first frequency signal corresponding to phase data determined by accumulating Y bits (where Y is an integer) on an MSB (Most Significant Bit) side of the frequency setting data; and
   wherein the second digital signal generator generates the second frequency signal corresponding to phase data determined by accumulating an X-bit signal validating Z bits (where Z=X−Y) on an LSB (Least Significant Bit) side of the frequency setting data.

3. The frequency synthesizer as set forth in claim 1, wherein the first digital signal generator sets the first output sampling frequency to a value higher than the second output sampling frequency of the second digital signal generator.

4. The frequency synthesizer as set forth in claim 3, wherein when a frequency setting data is X bits and an interpolation ratio is N (where N is an integer), the first digital signal generator generates the first frequency signal corresponding to phase data determined by accumulating Y bits on an MSB (Most Significant Bit) side of the frequency setting data; and
   wherein the second digital signal generator generates the second frequency signal corresponding to phase data determined by multiplying K-bit data by N (where K=X−log$_2$N) validating Z bits (where Z=X−Y) on an LSB (Least Significant Bit) side of the frequency setting data and then accumulating the multiplied value.

5. The frequency synthesizer as set forth in claim 4, wherein when the interpolation ratio N is a positive number and a radical root of 2, the second digital signal generator generates the second frequency signal corresponding to phase data determined by shifting K-bit data (where K=X−log$_2$N) validating Z bits (where Z=X−Y) on the LSB side of the frequency setting data to the MSB side by log$_2$N bits and then accumulating the shifted value.

6. The frequency synthesizer as set forth in claim 3, wherein the filter includes a CIC (Cascade Integrated Comb) filter.

7. The frequency synthesizer as set forth in claim 3, wherein the filter performs band rejection on bands other than a band where generation of spurious signals is allowed in the second frequency signal of the second digital signal generator.

8. The frequency synthesizer as set forth in claim 1, wherein the first and second digital signal generators each generate a signal having a constant phase and amplitude, when frequency setting data has a zero (0) value.

9. The frequency synthesizer as set forth in claim 1, wherein the first digital signal generator and the second digital signal generator each include a direct digital synthesizer (DDS).

10. The frequency synthesizer as set forth in claim 9, wherein the DDS comprises a ROM (Read Only Memory) for realizing a phase-amplitude conversion table, wherein a difference between a phase operation bit length and a ROM address bit length in a DDS corresponding to the first digital signal generator is less than a difference between a phase operation bit length and a ROM address bit length in a DDS corresponding to the second digital signal generator.

11. The frequency synthesizer as set forth in claim 10, wherein an output bit length in the DDS corresponding to the first digital signal generator is longer than an output bit length in the DDS corresponding to the second digital signal generator.

12. The frequency synthesizer as set forth in claim 9, wherein an output bit length in the DDS corresponding to the first digital signal generator is longer than an output bit length in the DDS corresponding to the second digital signal generator.

* * * * *